United States Patent
Pi et al.

(10) Patent No.: US 10,825,932 B2
(45) Date of Patent: Nov. 3, 2020

(54) THIN FILM TRANSISTOR HAVING LIGHT SHIELDING STRUCTURE

(71) Applicant: Electronics and Telecommunications Research Institute, Daejeon (KR)

(72) Inventors: Jae-Eun Pi, Daejeon (KR); Seung Youl Kang, Daejeon (KR); Jaehyun Moon, Daejeon (KR); Seongdeok Ahn, Daejeon (KR); Jongchan Lee, Seoul (KR); Chul Woong Joo, Sejong-si (KR); Chi-Sun Hwang, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 0 days.

(21) Appl. No.: 16/374,095

(22) Filed: Apr. 3, 2019

(65) Prior Publication Data

US 2019/0312148 A1 Oct. 10, 2019

(30) Foreign Application Priority Data

Apr. 4, 2018 (KR) .......................... 10-2018-0039363
Aug. 3, 2018 (KR) .......................... 10-2018-0090948

(51) Int. Cl.
*H01L 29/786* (2006.01)
*H01L 29/66* (2006.01)

(52) U.S. Cl.
CPC .. *H01L 29/78633* (2013.01); *H01L 29/66742* (2013.01); *H01L 29/78603* (2013.01); *H01L 29/78696* (2013.01)

(58) Field of Classification Search
CPC ................................................. H01L 29/78633
See application file for complete search history.

(56) References Cited

U.S. PATENT DOCUMENTS

2012/0132917 A1* 5/2012 Lee ...................... H01L 27/1218
257/59

FOREIGN PATENT DOCUMENTS

| CN | 102543832 B | 11/2013 |
|---|---|---|
| KR | 10-0546707 B1 | 1/2006 |
| KR | 10-2014-0085305 A | 7/2014 |
| KR | 10-2016-0066680 A | 6/2016 |

* cited by examiner

Primary Examiner — Thomas L Dickey
(74) Attorney, Agent, or Firm — Rabin & Berdo, P.C.

(57) ABSTRACT

Provided is a thin film transistor including a substrate, a first spacer on the substrate, a second spacer on the first spacer, a light shield layer intervened between the first spacer and the second spacer, a semiconductor layer on the second spacer, and a gate electrode on the semiconductor layer, wherein the light shield layer includes a plurality of inclined surfaces against a top surface of the substrate.

15 Claims, 8 Drawing Sheets

THIN FILM TRANSISTOR HAVING LIGHT SHIELDING STRUCTURE

CROSS-REFERENCE TO RELATED APPLICATIONS

This U.S. non-provisional patent application claims priority under 35 U.S.C. § 119 of Korean Patent Application Nos. 10-2018-0039363, filed on Apr. 4, 2018, and 10-2018-0090948, filed on Aug. 3, 2018, the entire contents of which are hereby incorporated by reference.

BACKGROUND

The present disclosure herein relates to a thin film transistor having a light shielding structure.

A thin film transistor is configured of three electrode terminals including a gate, a source, and a drain. Here, the source and drain may electrically contact a semiconductor layer configured to play a role of a current channel of the transistor. When a bias voltage is applied to a gate electrode, a channel current from the drain to the source may be controlled.

Such a thin film transistor may be applied to a display together with a process technology in which deposition and patterning are performed on a glass substrate. For example, the thin film transistor may be applied to a display device such as a TV, a monitor, an outdoor electronic billboard, or a mobile device.

The thin film transistor may be switched by a light source such as an external light source (back light or LED backlit) and an internal light source (OLED). In this case, the thin film transistor may be degraded by unwanted light and thus the characteristics thereof may be changed.

SUMMARY

The present disclosure provides a thin film transistor including a light shielding structure in which the light shielding structure is changed to protect the thin film transistor from incident light.

Issues to be addressed in the present disclosure are not limited to those described above and other issues unmentioned above will be clearly understood by those skilled in the art from the following description.

An embodiment of the inventive concept provides a thin film transistor including: a substrate; a first spacer on the substrate; a second spacer on the first spacer; a light shield layer intervened between the first spacer and the second spacer; a semiconductor layer on the second spacer; and a gate electrode on the semiconductor layer, wherein the light shield layer comprises a plurality of inclined surfaces against a top surface of the substrate.

In an embodiment, a width of the light shielding layer may be smaller than that of the semiconductor layer in a first direction parallel to the top surface of the substrate.

In an embodiment, the light shielding layer may penetrate through the first spacer, and include a bottom surface disposed to abut the substrate and parallel to the first direction, the inclined surfaces may be provided two in number, each of the inclined surfaces may be extended upwards from one side of the bottom surface, and the second spacer and the semiconductor layer conformally cover the bottom surface and the inclined surfaces of the light shielding layer.

In an embodiment, the thin film transistor may further include: a source and a drain disposed on the semiconductor layer and the second spacer, and separated from each other along the first direction; and a gate insulation layer disposed on the semiconductor layer, the source, and the drain, and disposed beneath the gate electrode.

In an embodiment, each of a separation distance between the source and the light shielding layer in the first direction, and a separation distance between the drain and the light shielding layer in the first direction may be from sub-micrometers to several micrometers or longer.

In an embodiment, each of the source, the drain, and the gate electrode may be transparent.

In an embodiment, each of the first spacer and the second spacer may have a thickness along a second direction that is vertical to the top surface of the substrate, and the thickness of the second spacer may be smaller than that of the first spacer.

In an embodiment, each of the two inclined surfaces may be opposite to each other about a second direction that is vertical to the top surface of the substrate.

In an embodiment, the width of the light shielding layer may be ½ of the width of the semiconductor layer or smaller.

In an embodiment, each inclination angle of the inclined surfaces of the light shielding layer may be about 45 degrees to about 90 degrees against the top surface of the substrate.

In an embodiment of the inventive concept, a thin film transistor includes: a substrate; a spacer on the substrate; a gate insulation layer on the spacer; a gate electrode intervened between the spacer and the gate insulation layer; and a semiconductor layer on the gate insulation layer, wherein a width of the gate electrode is smaller than a width of the semiconductor layer in a first direction parallel to a top surface of the substrate, and the gate electrode has a plurality of inclined surfaces against the top surface of the substrate.

In an embodiment, the gate electrode may penetrate through the spacer, the gate electrode may include a bottom surface disposed to abut the substrate and parallel to the first direction, the inclined surfaces may be provided two in number, each of the two inclined surfaces may be extended upwards from one side of the bottom surface, and the gate insulation layer and the semiconductor layer may conformally cover the bottom surface and the inclined surfaces of the gate electrode.

In an embodiment, the width of the gate electrode may be about ½ of the width of the semiconductor layer or smaller, and each inclination angle of the inclined surfaces of the gate electrode may be about 45 degrees to about 90 degrees against the top surface of the substrate.

In an embodiment of the inventive concept, a manufacturing method of a thin film transistor includes: forming a first spacer on a substrate; forming an opening part in the first spacer, the opening part having a plurality of inclined surfaces, the inclined surfaces inclined against a top surface of the substrate; forming a light shielding layer inside the opening part; forming a second spacer on the first spacer and the light shielding layer; forming a semiconductor layer on the second spacer; and forming a gate electrode on the semiconductor layer.

In an embodiment, the forming of the light shielding layer may include: depositing the light shielding layer on the first spacer including the opening part; and removing the light shielding layer in a remaining region other than the light shielding layer inside the opening part on the first spacer.

In an embodiment, an inclination angle of the inclined surfaces of the opening part may be about 45 degrees to about 90 degrees against the top surface of the substrate, each of the opening part and the semiconductor layer may have a width along a first direction parallel to the top surface of the substrate, the width of the opening part may be about ½ of the width of the semiconductor layer or smaller, each of the first spacer and the second spacer may have a thickness along a second direction vertical to the top surface of the substrate, and the thickness of the second spacer may be smaller than the thickness of the first spacer.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

The embodiments of the present invention will now be described with reference to the accompanying drawings for sufficiently understating a configuration and effects of the inventive concept. However, the inventive concept is not limited to the following embodiments and may be embodied in different ways, and various modifications may be made thereto. The embodiments are just given to provide complete disclosure of the inventive concept and to provide thorough understanding of the inventive concept to those skilled in the art. In the accompanying drawings, the sizes of the elements may be greater than the actual sizes thereof, for convenience of description, and the scales of the elements may be exaggerated or reduced.

Unless otherwise defined, all terms used herein have the same meaning as commonly understood by one of ordinary skill in the art to which this invention pertains. Hereinafter, the embodiments of the inventive concept will now be described in detail with reference to the accompanying drawings.

Figure 1:
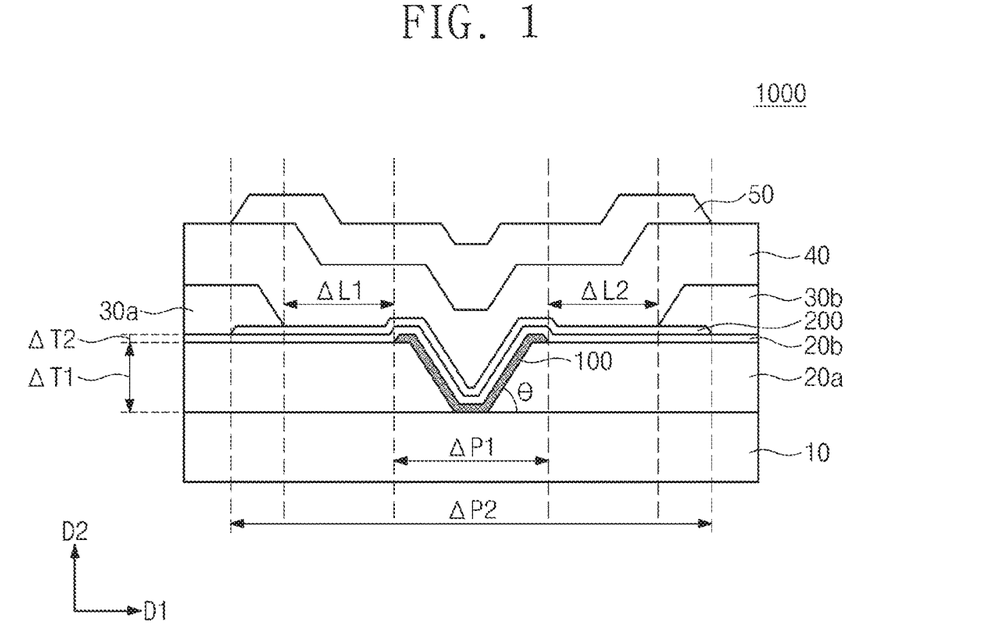
FIG. 1 is a cross-sectional view of a thin film transistor provided with a light shielding structure according to an embodiment of the inventive concept.
Figure 2:
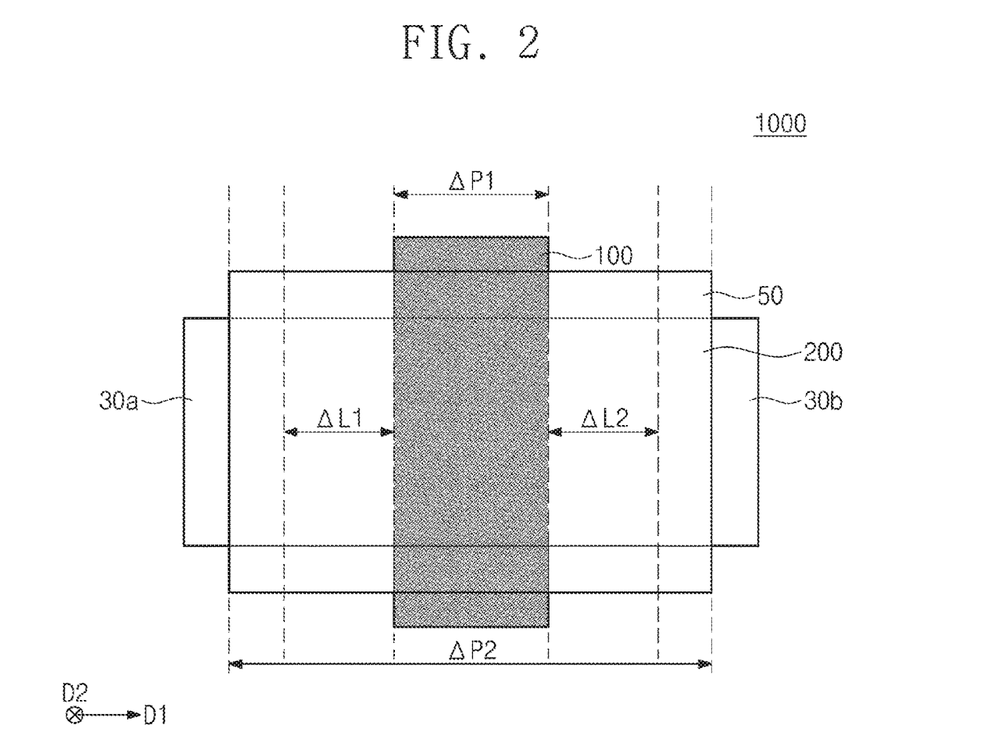
FIG. 2 is a plan view of FIG. 1.

FIG. 1 is a cross-sectional view of a thin film transistor provided with a light shielding structure according to an embodiment of the inventive concept. FIG. 2 is a plan view of FIG. 1.

In relation to FIGS. 1 and 2, a top-gate type transistor 1000 may be provided.

A first spacer 20a may be provided on a substrate 10. A second spacer 20b may be provided on the first spacer 20a. A light shielding layer 100 may be intervened between the first spacer 20a and the second spacer 20b. A semiconductor layer 200 may be provided on the second spacer 20b. A source 30a and a drain 30b may be disposed on the semiconductor layer 200 and the second spacer 20b to be separated from each other along a first direction D1. A gate insulation layer 40 may be provided on the semiconductor layer 200, the source 30a and the drain 30b. A gate electrode 50 may be provided on the gate insulation layer 40.

A material configured to provide the substrate 10 may include a transparent glass or the like.

The first spacer 20a and the second spacer 20b may respectively have the thicknesses $^\Delta T1$ and $^\Delta T2$ along a second direction D2 vertical to a top surface of the substrate 10. The thickness $^\Delta T2$ of the second spacer 20b may be smaller than the thickness $^\Delta T1$ of the first spacer 20a.

The first spacer 20a, the second spacer 20b, and the gate insulation layer 40 may be provided with an insulation material. The insulation material may be provided with a silicon oxide layer, a silicon nitride layer, or a stacked layer thereof.

The light shielding layer 100 may penetrate through the first spacer 20a to abut the substrate 10. The light shielding layer 100 may include the bottom surface disposed to abut the substrate 10 and parallel to the first direction D1. The light shielding layer 100 may have a plurality of inclined surfaces inclined against the top surface of the substrate 10. For example, the inclined surfaces may be provided two in number. Each of the two inclined surfaces may be extended upwards from one side of the bottom surface.

Each inclination angle Θ of the inclined surfaces of the light shielding layer 100 may be from about 40 degrees to 90 about degrees against the top surface of the substrate 10. Each of the two inclined surfaces may be opposite to each other about the second direction D2. The second spacer 20b and the semiconductor layer 200 may conformally cover the bottom surface and the inclined surfaces of the light shielding layer 100.

A material configured to provide the light shielding layer 100 may not pass light of a specific wavelength. The specific wavelength light may have a wavelength having an energy excited by an electron of the semiconductor layer 200. The material configured to provide the light shielding layer 100 may include at least any one of molybdenum, titanium, molybdenum-titanium, or the like. The light shielding layer 100 and the semiconductor layer 200 may respectively have the widths $^\Delta P1$ and $^\Delta P2$ in the first direction D1. The width $^\Delta P1$ of the light shielding layer 100 may be smaller than the width $^\Delta P2$ of the semiconductor layer 200. The width $^\Delta P1$ of the light shielding layer 100 may be about ½ of the width $^\Delta P2$ of the semiconductor layer 200 or smaller, and larger than 0.

The source 30a and the drain 30b may have the separation distances $^\Delta L1$ and $^\Delta L2$ from the light shielding layer 100 in the first direction D1. Each of the separation distances $^\Delta L1$ and $^\Delta L2$ may be from sub-micrometers to several micrometers or longer.

Each of the source 30a, the drain 30b, and the gate electrode 50 may be transparent. A material configured to provide the source 30a, the drain 30b, and the gate electrode 50 may include at least any one of Indium tin oxide (ITO), indium zinc oxide (IZO), zinc oxide (ZnO), indium tin zinc oxide (ITZO), or the like that are transparent and conductive materials.

Figure 3:
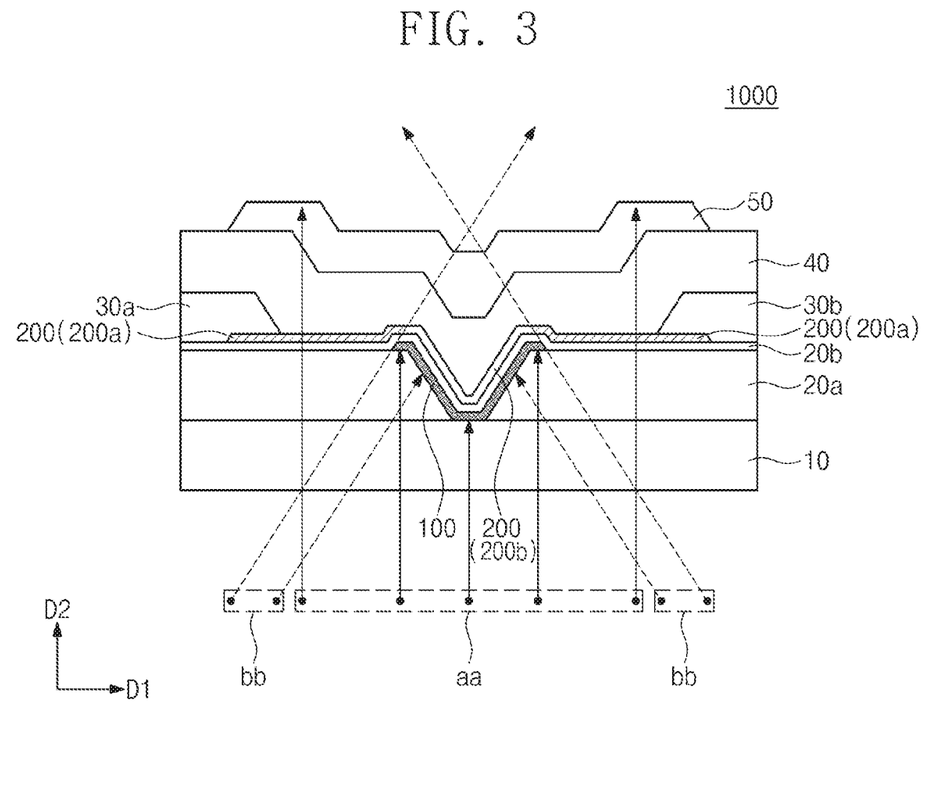
FIG. 3 is a cross-sectional view illustrating a case in which light is incident to a lower portion of the thin film transistor.
Figure 4:
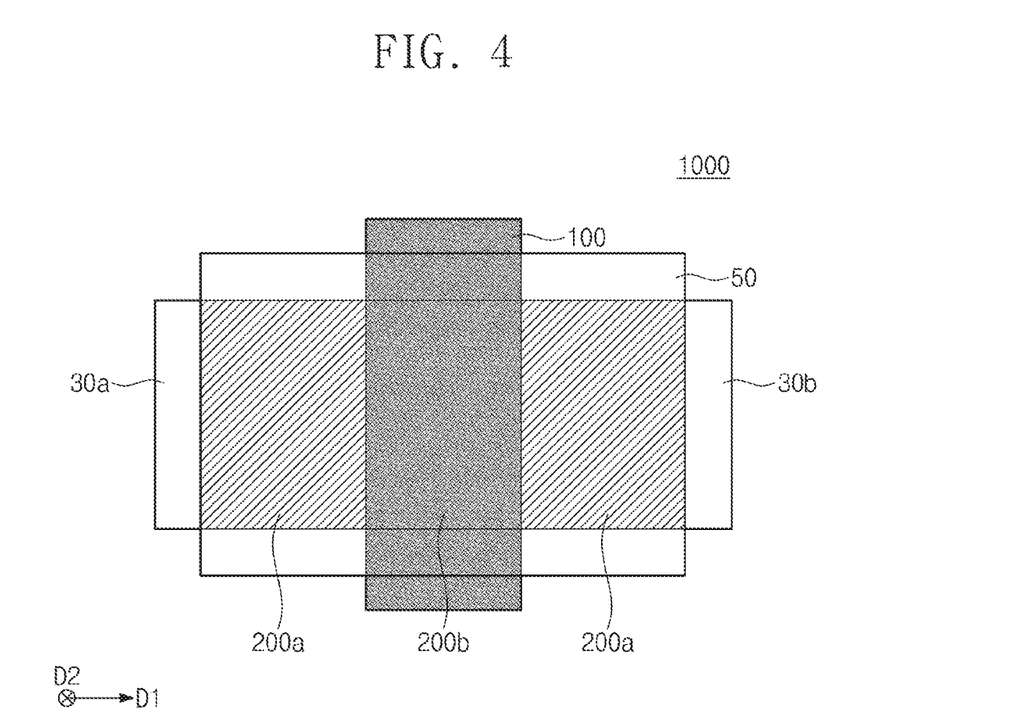
FIG. 4 is a plan view of FIG. 3.

FIG. 3 is a cross-sectional view illustrating a case in which light is incident to a lower portion of the thin film transistor. FIG. 4 is a plan view of FIG. 3.

In relation to FIGS. 3 and 4, external light may be incident to the semiconductor layer 200 from the lower portion of the thin film transistor 1000.

The external light may include vertical light aa and ambient light bb. The vertical light aa is light vertical to the top surface of the substrate 10, and the ambient light bb is light that is not vertical nor parallel to the top surface of the substrate 10.

The light shielding layer 100 may block both the vertical light aa and the ambient light bb incident to the semiconductor layer 200 as much as the area occupied by the light shielding layer 100. In particular, the inclined surface of the light shielding layer 100 may effectively block the ambient light bb from being incident to the semiconductor layer 200.

The external light may be light having a specific wavelength at which an electron of the semiconductor layer 200 is excited from the valence band to the conduction band. When the electron is excited, an active region 200a in which a channel is provided in the semiconductor layer 200 may be generated.

The active region 200a may be a region of the semiconductor layer 200 that is not shielded by the light shielding layer 100. In addition, the semiconductor layer 200 may include a region shielded by the light shielding layer 100, namely, an inactive region 200b in which the channel is not provided.

When the entire semiconductor layer 200 has the active region 200a, a photocurrent may flow through the channel In other words, even when a voltage is not applied to the gate electrode 50, a current may flow from the drain 30b to the source 30a. In FIGS. 3 and 4, the semiconductor layer 200 has the inactive region 200b, and thus the current may not flow from the drain 30b to the source 30a.

Figure 5:
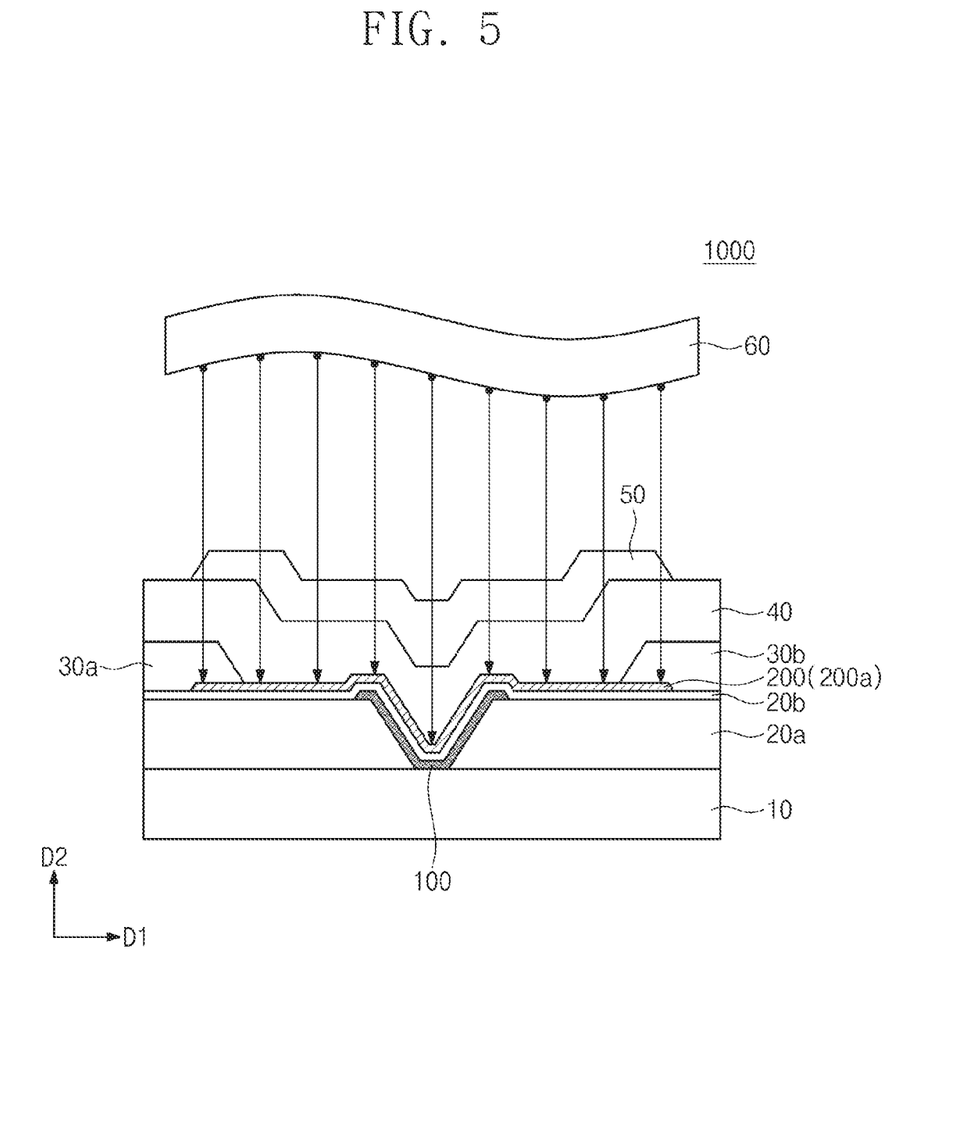
FIG. 5 is a cross-sectional view illustrating a case in which light is incident to an upper portion of the thin film transistor.

FIG. 5 is a cross-sectional view illustrating a case in which light is incident to an upper portion of the thin film transistor.

In relation to FIG. 5, light may be incident towards the top surface of the semiconductor layer 200 from an upper light source 60. The light incident from the upper light source 60 may be light incident to the top surface of the semiconductor layer 200 through a process in which light incident from an emitter positioned over the thin film transistor 1000 or light incident from an emitter positioned under the thin film transistor 1000 is reflected.

The light of a specific wavelength, which is incident towards the top surface of the semiconductor layer 200 from the upper light source 60 may excite the electron in the semiconductor layer 200. In other words, the entire semiconductor layer 200 may have the active region 200a. As a result, a current may flow from the drain 30b to the source 30a.

Comparing FIG. 3 with FIG. 5, when the light is incident to the bottom surface of the semiconductor layer 200 in a state where a voltage is not applied to the gate electrode 50 (FIG. 3), the current may not flow between the drain 30b and the source 30a. In addition, when the light is incident to the top surface of the semiconductor layer 200 in a state where a voltage is not applied to the gate electrode 50 (FIG. 5), the current may flow between the drain 30b and the source 30a.

The thin film transistor 1000 may operate as an optical sensor. The light incident towards the top surface of the semiconductor layer 200 from the upper light source 60 may include light reflected from an external pattern (for example, fingerprint, vein, photograph, document, or the like).

For example, the electron of the semiconductor layer 200 may be excited by blue wavelength light, and the light shielding layer 100 may block the blue wavelength light. When the blue wavelength light is reflected by the external pattern, the current flows only in a case where the light is incident to the top surface of the light shielding layer 100.

Since reacting only to light of a specific wavelength and light of a specific direction, the thin film transistor 1000 provided with the light shielding structure according to the embodiment of the inventive concept may effectively operate as an optical sensor.

Figure 6:
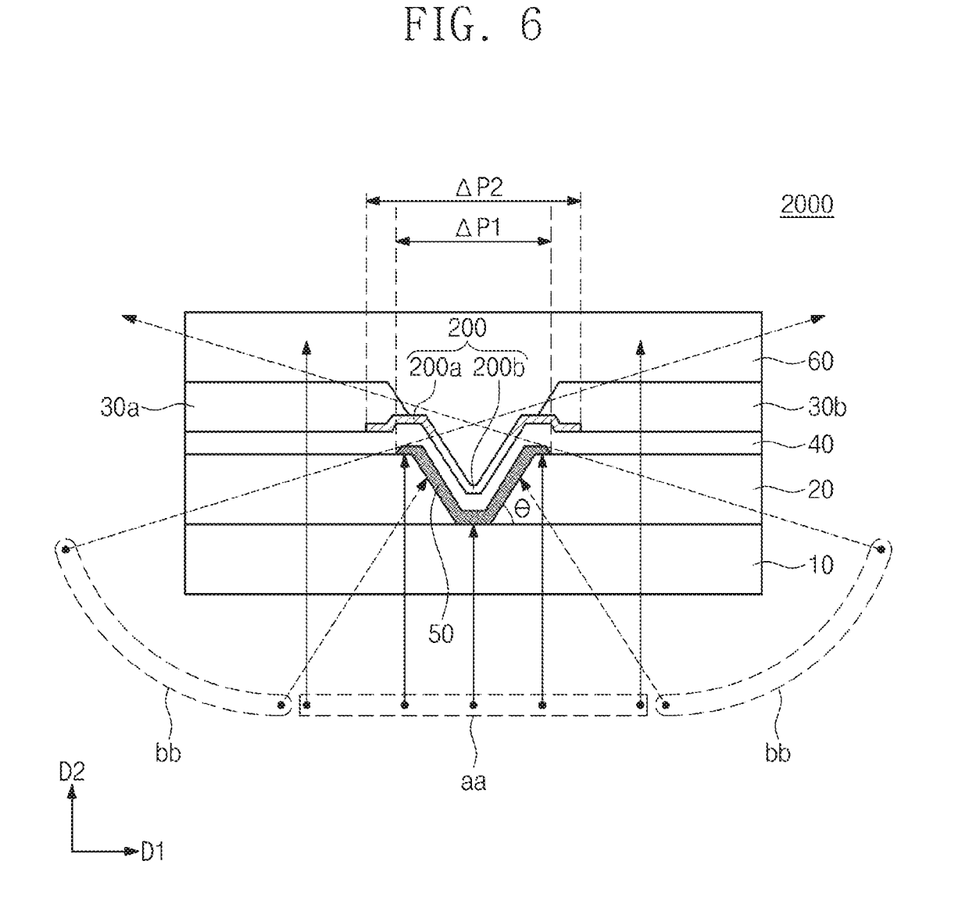
FIG. 6 is a cross-sectional view of a thin film transistor according to another embodiment of the inventive concept.

FIG. 6 is a cross-sectional view of a thin film transistor according to another embodiment of the inventive concept.

In relation to FIG. 6, a bottom-gate thin film transistor 2000 may be provided.

A spacer 20 may be provided on a substrate 10. A gate insulation layer 40 may be provided on the spacer 20. A gate electrode 50 may be provided between the spacer 20 and the gate insulation layer 40. A semiconductor layer 200 may be provided on the gate insulation layer 40. A source 30a and a drain 30b may be provided which are disposed on the gate insulation layer 40 and the semiconductor layer 200, and separated from each other along a first direction D1. A protection layer 60 may be provided on the semiconductor layer 200, the source 20a and the drain 30b.

The gate electrode 50 and the semiconductor layer 200 may respectively have the widths $^\Delta$P1 and $^\Delta$P2 in the first direction D1. The width $^\Delta$P1 of the gate electrode 50 may be smaller than the width $^\Delta$P2 of the semiconductor layer 200. The width $^\Delta$P1 of the gate electrode 50 may be about ½ of the width $^\Delta$P2 of the semiconductor layer 200 or smaller, and larger than 0.

The gate electrode 50 may penetrate through the spacer 20. The gate electrode 50 may include the bottom surface disposed to abut the substrate 10 and to be parallel to the first direction D1. The gate electrode 50 may include a plurality of inclined surfaces. For example, the plurality of inclined surfaces may be provided two in number. Each of the two inclined surfaces may be extended upwards from one side of the bottom surface.

Each inclination angle Θ of the inclined surfaces of the gate electrode 50 may be from about 45 degrees to about 90 degrees against the top surface of the substrate 10. Each of the two inclined surfaces may be opposite to each other about the second direction D2. The gate insulation layer 40 and the semiconductor layer 200 may conformally cover the bottom surface and the inclined surfaces of the gate electrode 50.

The gate electrode 50 having the inclined surfaces may protect the semiconductor layer 200 from vertical light aa and ambient light bb. A region of the semiconductor, which is not protected by the gate electrode 50, may be an active region 200a. In addition, another region of the semiconductor, which is protected by the gate electrode 50, may be an inactive region 200b.

Since the semiconductor layer 200 partially includes the inactive region 200b, a current may not flow from the drain 30b to the source 30a. According to the present embodiment, the gate electrode 50 may function as the light shielding layer 100 as described above with reference to FIGS. 1 to 5. The gate electrode 50 may include a plurality of conductive materials that do not transmit light. For example, the gate electrode 50 may include at least any one of molybdenum (Mo), aluminum (Al), chromium (Cr), titanium (Ti), nickel (Ni), neodymium (Nd), copper (Cu), or the like.

FIGS. 7 to 15 illustrate a method of manufacturing a thin film transistor according to an embodiment of the inventive concept.

Figure 7:
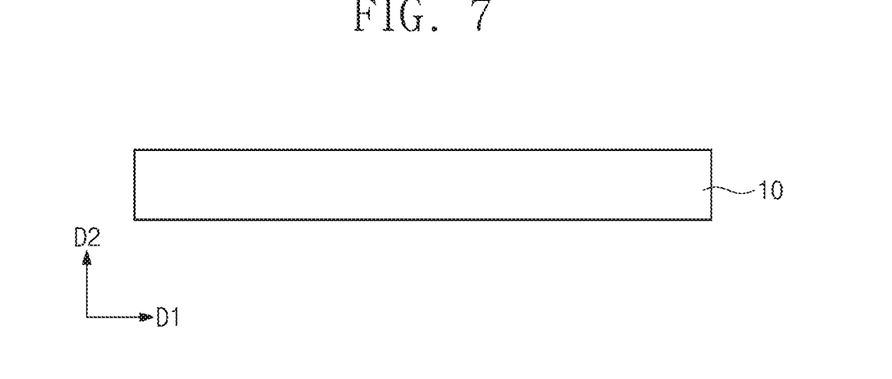
FIGS. 7 to 15 illustrate a method of manufacturing a thin film transistor according to an embodiment of the inventive concept.
Figure 8:
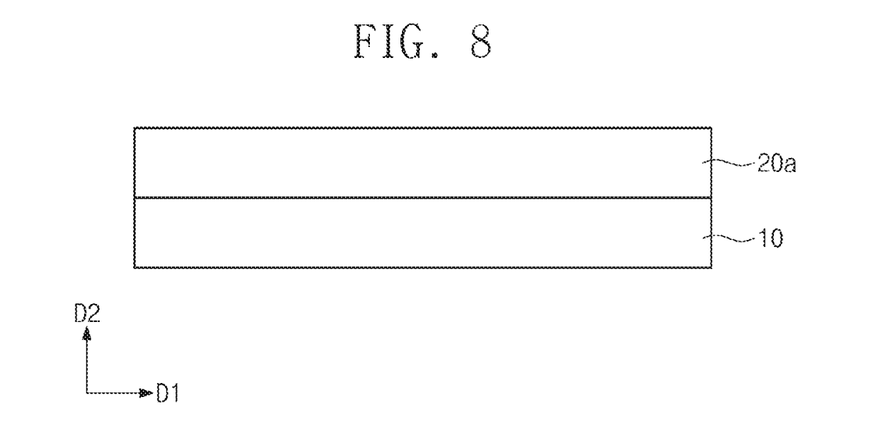

Referring to FIGS. 7 and 8, the first spacer 20a may be disposed on the substrate 10. As a scheme for providing the first spacer 20a, a chemical vapor deposition (CVD) process or the like may be used.

Figure 9:
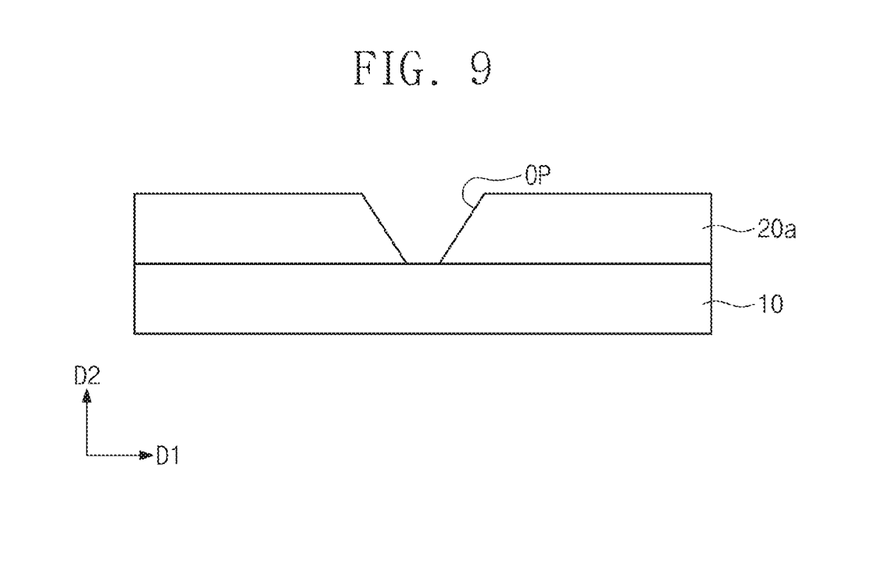

In relation to FIG. 9, an opening part OP may be disposed which has an inclined surface symmetric to the first spacer 20a about the second direction D2. In order to provide the opening part OP, a photolithography process and an etching process are sequentially proceeded on the first spacer 20a. As the etching process, both a wet etching process and a dry etching process may be used. When the dry etching process is used, an inclined surface close to verticality may be implemented. In order to block the ambient light, the opening part OP may be etched to provide an inclination angle from about 45 degrees to about 90 degrees.

Figure 10:
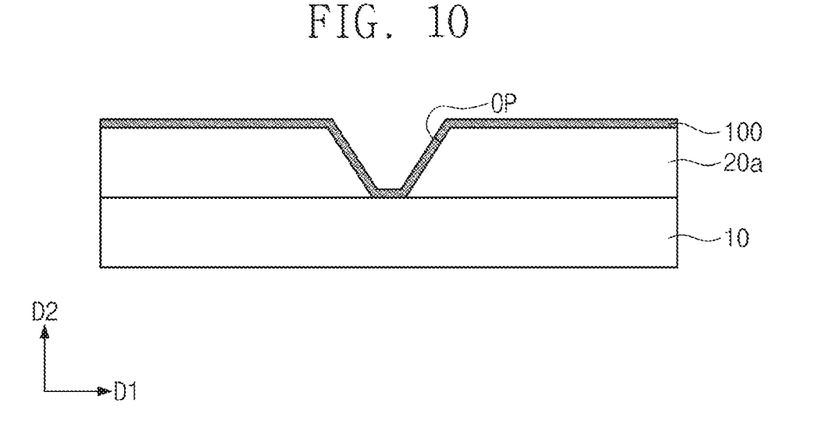
Figure 11:
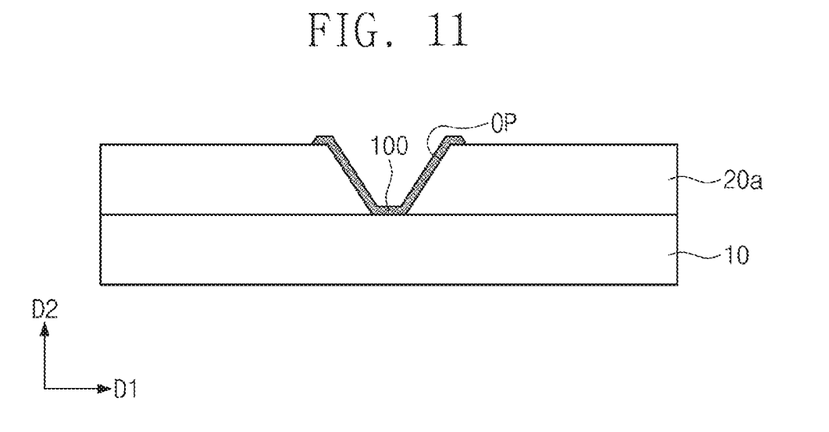

Referring to FIGS. 10 and 11, the light shielding layer 100 may be disposed in the opening part OP. To form the light shielding layer 100 may include to deposit the light shielding layer 100 on the first spacer 20a, which includes the opening part OP, and to remove the light shielding layer 100 in the remaining region other than the light shielding layer 100 inside the opening part OP on the first spacer 20a. As a scheme for depositing the light shielding layer 100, a CVD process or the like may be used. As a scheme for removing the light shielding layer 100, a photolithography process and an etching process may be used.

Figure 12:
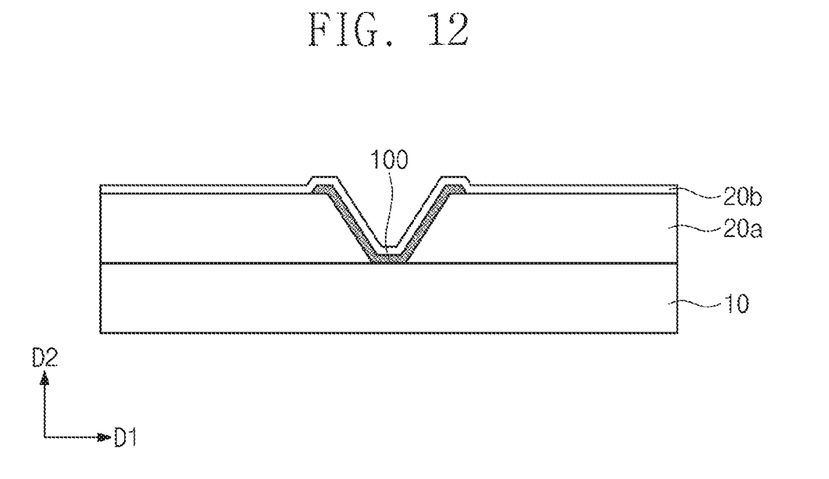

In relation to FIG. 12, the second spacer 20b may be disposed on the light shielding layer 100 and the first spacer 20a. The second spacer 20b may be conformally deposited through the CVD process or the like. It may be advantageous that the second spacer 20b is deposited thinner than the first spacer 20a. The thickness of the second spacer 20b may be several nanometers to several hundred nanometers. When the second spacer 20b is deposited as thin as possible, a variation in threshold voltage of the thin film transistor may be prevented.

Figure 13:
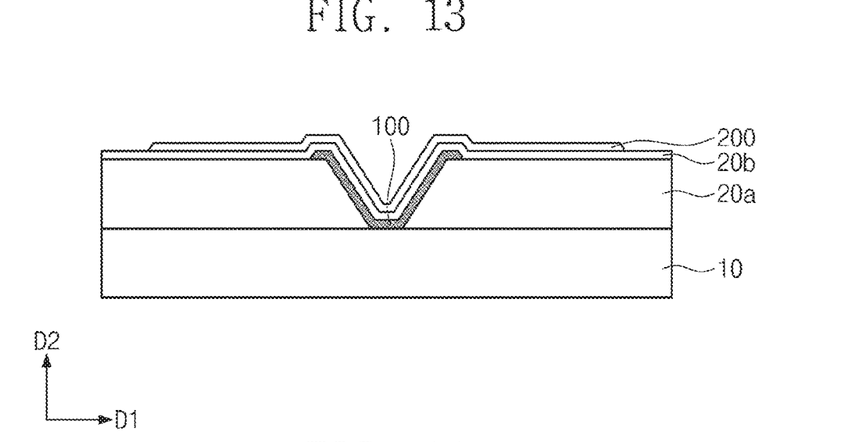

In relation to FIG. 13, the semiconductor layer 200 may be provided on the second spacer 20b. The semiconductor layer 200 may be conformally deposited through a CVD process or the like. After the deposition process, a photolithography process and an etching process may be sequentially performed.

Figure 14:
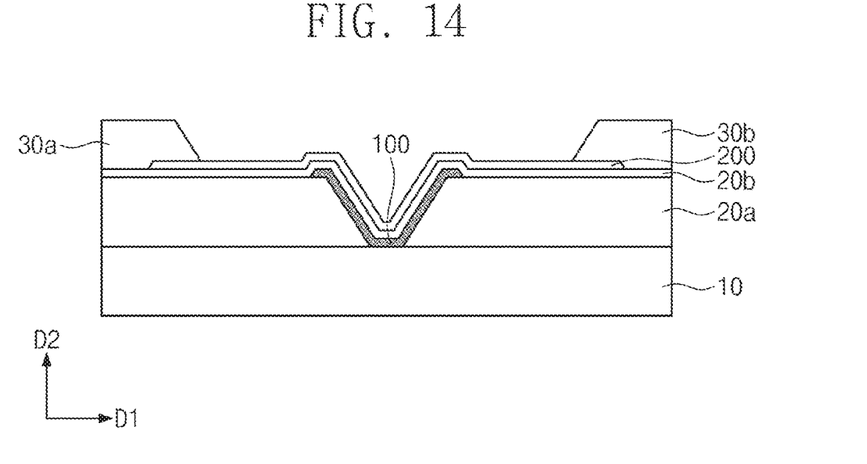

In relation to FIG. 14, the source 30a and the drain 30b may be disposed on the second spacer 20b and the semiconductor layer 200 to be separated from each other along the first direction D1. As a scheme for forming the source 30a and the drain 30b, a CVD process or the like may be used.

Figure 15:
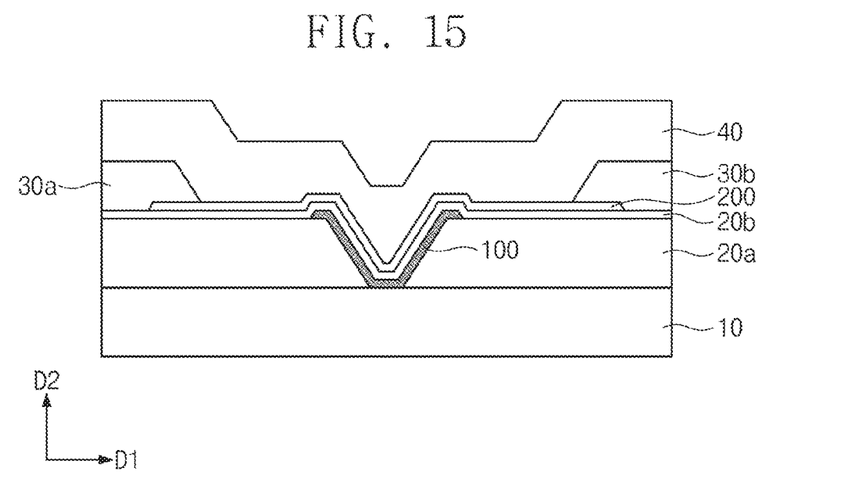

In relation to FIG. 15, the gate insulation layer 40 may be disposed on the source 30a, the drain 30b, and the semiconductor layer 200. As a scheme for forming the gate insulation layer 40, a CVD process or the like may be used.

Referring to FIG. 1 again, the gate electrode 50 may be disposed on the gate insulation layer 40. As a scheme for forming the gate electrode 50, a CVD process or the like may be used.

According to embodiments of the inventive concept, the thin film transistor may be provided with the light shielding structure so as to block the light from being incident to the semiconductor layer from the lower portion of the thin film transistor.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor comprising:
a substrate;
a first spacer on the substrate;
a second spacer on the first spacer;
a light shield layer intervened between the first spacer and the second spacer;
a semiconductor layer on the second spacer; and
a gate electrode on the semiconductor layer,
wherein the light shield layer comprises a plurality of inclined surfaces against a top surface of the substrate.

2. The thin film transistor of claim 1, wherein a width of the light shielding layer is smaller than that of the semiconductor layer in a first direction parallel to the top surface of the substrate.

3. The thin film transistor of claim 2, wherein
the light shielding layer penetrates through the first spacer, and includes a bottom surface disposed to abut the substrate and parallel to the first direction,
the inclined surfaces are provided two in number, and each of the inclined surfaces is extended upwards from one side of the bottom surface, and
the second spacer and the semiconductor layer conformally cover the bottom surface and the inclined surfaces of the light shielding layer.

4. The thin film transistor of claim 3, wherein each of the first spacer and the second spacer has a thickness along a second direction that is vertical to the top surface of the substrate, and the thickness of the second spacer is smaller than that of the first spacer.

5. The thin film transistor of claim 3, wherein each of the two inclined surfaces is opposite to each other about a second direction that is vertical to the top surface of the substrate.

6. The thin film transistor of claim 3, wherein the width of the light shielding layer is about ½ of the width of the semiconductor layer or smaller.

7. The thin film transistor of claim 3, wherein each inclination angle of the inclined surfaces of the light shielding layer is about 45 degrees to about 90 degrees against the top surface of the substrate.

8. The thin film transistor of claim 3, further comprising:
a source and a drain disposed on the semiconductor layer and the second spacer, and separated from each other along the first direction; and
a gate insulation layer disposed on the semiconductor layer, the source, and the drain, and disposed beneath the gate electrode.

9. The thin film transistor of claim 8, wherein each of a separation distance between the source and the light shielding layer in the first direction, and a separation distance between the drain and the light shielding layer in the first direction is from sub-micrometers to several micrometers or longer.

10. The thin film transistor of claim 8, wherein each of the source, the drain, and the gate electrode is transparent.

11. A thin film transistor comprising:
a substrate;
a spacer on the substrate;
a gate insulation layer on the spacer;
a gate electrode intervened between the spacer and the gate insulation layer;
a semiconductor layer on the gate insulation layer; and
a trench penetrating the spacer vertically and exposing an upper surface of the substrate and inner surfaces of the spacer,
wherein a width of the gate electrode is smaller than a width of the semiconductor layer in a first direction parallel to a top surface of the substrate,
wherein the gate electrode fills a portion of the trench,
wherein the gate insulation layer and the semiconductor layer fill at least a portion of the rest of the trench on the gate electrode, wherein the gate electrode has a bottom surface and a pair of inclined surfaces extending upward from the bottom surface, wherein the bottom surface of the gate electrode contacts the top surface of the substrate, wherein each of the pair of inclined surfaces of the gate electrode contacts a corresponding one of the inner surfaces of the spacer, and wherein in the trench, the pair of inclined surfaces of the gate electrode are spaced apart along the first direction with the gate insulation layer and the semiconductor layer being interposed therebetween.

12. The thin film transistor of claim 11, wherein the width of the gate electrode is about ½ of the width of the semiconductor layer or smaller, and each inclination angle of the inclined surfaces of the gate electrode is about 45 degrees to about 90 degrees against the top surface of the substrate.

13. A manufacturing method of a thin film transistor, the method comprising:

forming a first spacer on a substrate;

forming an opening part in the first spacer, the opening part having a plurality of inclined surfaces, the inclined surfaces inclined against a top surface of the substrate;

forming a light shielding layer inside the opening part;

forming a second spacer on the first spacer and the light shielding layer;

forming a semiconductor layer on the second spacer; and forming a gate electrode on the semiconductor layer.

14. The manufacturing method of claim 13, wherein the forming of the light shielding layer comprises:

depositing the light shielding layer on the first spacer including the opening part; and removing the light shielding layer in a remaining region other than the light shielding layer inside the opening part on the first spacer.

15. The manufacturing method of claim 13, wherein an inclination angle of the inclined surfaces of the opening part is about 45 degrees to about 90 degrees against the top surface of the substrate, each of the opening part and the semiconductor layer has a width along a first direction parallel to the top surface of the substrate, the width of the opening part is about ½ of the width of the semiconductor layer or smaller, each of the first spacer and the second spacer has a thickness along a second direction vertical to the top surface of the substrate, and the thickness of the second spacer is smaller than the thickness of the first spacer.

* * * * *